United States Patent
Gagnon et al.

(10) Patent No.: US 6,329,272 B1
(45) Date of Patent: Dec. 11, 2001

(54) METHOD AND APPARATUS FOR ITERATIVELY, SELECTIVELY TUNING THE IMPEDANCE OF INTEGRATED SEMICONDUCTOR DEVICES USING A FOCUSSED HEATING SOURCE

(75) Inventors: Yves Gagnon, Lafontaine; Michel Meunier, Pierrefonds; Yvon Savaria, Montreal, all of (CA)

(73) Assignee: Technologies LTrim Inc., Montreal (CA)

( * ) Notice: Subject to any disclaimer, the term of this patent is extended or adjusted under 35 U.S.C. 154(b) by 0 days.

(21) Appl. No.: 09/332,059

(22) Filed: Jun. 14, 1999

(51) Int. Cl.$^7$ .................................................. H01L 21/22

(52) U.S. Cl. ..................... 438/549; 438/545; 438/550; 438/557

(58) Field of Search ................... 438/542, 543, 438/544, 545, 549, 550, 557

(56) References Cited

U.S. PATENT DOCUMENTS

| | | | |
|---|---|---|---|
| 3,191,151 | 6/1965 | Price | 340/166 |
| 4,298,855 | 11/1981 | Mills | 338/35 |
| 4,351,674 | 9/1982 | Yoshida et al. | 148/1.5 |
| 4,566,936 | 1/1986 | Bowlin | 156/627 |
| 4,585,490 | 4/1986 | Raffel et al. | 148/1.5 |
| 4,622,856 | 11/1986 | Binder et al. | 73/727 |
| 4,636,404 | 1/1987 | Raffel et al. | 427/53.1 |
| 4,646,057 | 2/1987 | Reynolds | 338/312 |
| 4,694,568 | 9/1987 | Morelli et al. | 29/620 |
| 4,713,649 | 12/1987 | Hino | 340/347 |
| 4,792,779 | 12/1988 | Pond et al. | 338/195 |
| 4,794,367 | 12/1988 | Ashe et al. | 338/308 |
| 4,810,663 | 3/1989 | Raffel et al. | 437/19 |
| 4,843,034 | 6/1989 | Herndon et al. | 437/189 |
| 4,900,112 | 2/1990 | Kawachi et al. | 350/96.12 |
| 4,929,923 | 5/1990 | Dharmadhikari | 338/308 |
| 4,937,475 | 6/1990 | Rhodes et al. | 307/465 |
| 5,075,241 | 12/1991 | Spratt et al. . | |
| 5,087,589 | 2/1992 | Chapman et al. | 437/195 |
| 5,110,758 | 5/1992 | Baskett | 437/171 |
| 5,119,538 | 6/1992 | White et al. | 29/612 |
| 5,124,596 | 6/1992 | Wurcer | 307/571 |

(List continued on next page.)

FOREIGN PATENT DOCUMENTS

| | | | | |
|---|---|---|---|---|
| 0 450 648 A1 | 4/1991 | (EP) | ................. | H01C/17/22 |
| 59-229838 | 12/1984 | (JP) | ................. | H01L/21/82 |
| 5243499 | 9/1993 | (JP) | ................. | H01L/27/04 |
| 6013549 | 1/1994 | (JP) | ................. | H01L/27/04 |

OTHER PUBLICATIONS

Bernstein, Joseph B.; Colella, Barry D.; Laser–Formed Metallic Connections Employing a Lateral Link Structure; IEEE Transactions on Components, Packaging, and Manufacturing Technology, Sep. 1995, pp. 690 to 692, Part A vol 18 No 3.

Bernstein, Joseph B.; Ventura, Thomas M.; Radomski, Aaron T.; Laser Induced Microfracture Leading to High Density Metal–to–Metal Connections; MIT Lincoln Laboratory, Lexington, MA 02173 (no date).

(List continued on next page.)

Primary Examiner—Olik Chaudhuri
Assistant Examiner—Ginette Peralta
(74) Attorney, Agent, or Firm—Ronald S. Kosie; Robert Brouillette

(57) ABSTRACT

The invention relates to a method of iteratively, selectively tuning the impedance of integrated semiconductor devices, by modifying the dopant profile of a region of low dopant concentration by controlled diffusion of dopants from one or more adjacent regions of higher dopant concentration through the melting action of a focussed heating source, for example a laser. In particular the method is directed to increasing the dopant concentration of the region of lower dopant concentration, but may also be adapted to decrease the dopant concentration of the region.

30 Claims, 6 Drawing Sheets

U.S. PATENT DOCUMENTS

| | | | |
|---|---|---|---|
| 5,159,418 | 10/1992 | Tokuno | 357/24 |
| 5,206,623 | 4/1993 | Rochette et al. | 338/203 |
| 5,209,122 | 5/1993 | Matly et al. | 73/727 |
| 5,233,327 | 8/1993 | Bartush et al. | 338/195 |
| 5,262,615 | 11/1993 | Hancock | 219/121.69 |
| 5,284,794 | 2/1994 | Isobe et al. | 437/173 |
| 5,389,956 | 2/1995 | Hadimioglu et al. | 347/12 |
| 5,420,515 | 5/1995 | Uhling et al. | 324/601 |
| 5,446,260 | 8/1995 | Uhling et al. | 219/121.69 |
| 5,493,892 | 2/1996 | Sherman | 73/3 |
| 5,507,171 | 4/1996 | Mattes et al. | 73/1 B |
| 5,525,831 | 6/1996 | Ohkawa et al. | 257/543 |
| 5,525,910 | 6/1996 | Uhling et al. | 324/601 |
| 5,569,398 | 10/1996 | Sun et al. | 219/121.68 |
| 5,618,741 | 4/1997 | Young et al. | 438/151 |
| 5,685,995 | 11/1997 | Sun et al. | 219/121.6 |

OTHER PUBLICATIONS

Bernstein, Joseph B.; Ventura, Thomas M.; Radomski, Aaron T.; High Density Laser Linking of Metal Interconnect; IEEE Transactions on Components, Packaging, and Manufacturing Technology, Dec. 1994, pp. 590 593, Part A vol 17 No 4.

Chapman, G.H.; Laser Interconnection Techniques for Defect Avoidance in Large–Area Restructurable Silicon Systems; Microelectronics Journal, 1992, pp. 267 272, Elsevier Science Publishers Ltd.

Cohen, Simon S.; Wyatt, Peter W.; Chapman, Glenn H.; Canter, Joseph M., Laser–Induced Diode Linking for Wafer –Scale Integration; IEEE Transactions on Electronic Devices, Sep. 1988, pp. 1533 1550, vol 35 No 9.

Erdi, George, A. Precision Trim Technique for Monolithic Analog Circuits; IEEE Journal of Solid–State Circuits, Dec. 1975, pp. 412 to 416, vol. SC–10 No. 6.

Fehlhaber, Peter, Laser Trimming of Silicon–Chromium Thin–Film Resistors; Solid–State Technology, Jul. 1971, pp. 33 to 36.

Narayana, Badri T.; Ramkumar, K.; Satyam, M., Mechanism for Downward Trimming of Polymer Resistors; Department of Electrical Communication Engineering, Indian Institute of Science, Nov. 1991, pp. 717 to 721, Bangalore, India.

Rasera, Roy L.; Berstein, Joseph B., Laser Linking of Metal Interconnect: Linking Dynamics and Failure Analysis; IEEE Transactions on Components, Packaging, and Manufacturing Technology, Dec. 1996, pp. 554 to 561, Part A vol. 19 No. 4.

Shen, Yu–Lin; Suresh, Subra; Berstein, Joseph B., Laser Linking of Metal Interconnects: Analysis and Design Considerations; IEEE Transactions on Electron Devices, Mar. 1996, pp. 402 to 410, vol. 43 No. 3.

Shier, John, A Finite–Mesh Technique for Laser Trimming of Thin–Film Resistors; IEEE Journal of Solid–State Circuits, Aug. 1998, pp. 1005 to 1009, vol. 23 No. 4.

| NUMBER OF APPLICATIONS | POWER mW | DURATION OF THE APPLICATION (μsec) | DIAMETER OF BEAM (μm) | RESISTANCE (Ω) |
|---|---|---|---|---|
| 1 | 1400 | 1,44 | 4 | 188,9 |
| 2 | 1400 | 1,44 | 4 | 148,6 |
| 3 | 1400 | 0,96 | 4 | 142,8 |
| 4 | 1400 | 0,48 | 4 | 141,4 |
| 5 | 200 | 0,48 | 4 | 140,1 |
| 6 | 200 | 0,48 | 4 | 140,0 |

METHOD AND APPARATUS FOR ITERATIVELY, SELECTIVELY TUNING THE IMPEDANCE OF INTEGRATED SEMICONDUCTOR DEVICES USING A FOCUSSED HEATING SOURCE

BACKGROUND OF THE INVENTION

The present invention relates to the field of integrated semiconductor devices, and is directed to a method and apparatus for iteratively, selectively tuning (i.e. modifying, changing) the impedance of integrated semiconductor devices using a focussed heating source. More particularly, the invention relates to a method of selectively tuning the impedance of integrated semiconductor devices, by modifying the dopant profile of a region of low dopant concentration (i.e. increasing the dopant concentration) by controlled diffusion of dopants from one or more adjacent regions of higher dopant concentration through the melting action of a focussed heating source, for example a laser.

The use of lasers in the field of integrated semiconductor devices is known in the art, for example U.S. Pat. No. 4,636,404 to Raffle et al., U.S. Pat. No. 5,087,589 to Chapman, et al., U.S. Pat. No. 4,585,490 to Raffle et al. However, lasers in this field have mainly been used for creating links between various components, for implementing defect avoidance using redundancy in large random access memories and in complex VLSI circuits, and for restructuring or repairing circuits. For example, U.S. Pat. No. 4,636,404 uses a laser to create a conductive, low resistance bridge across a gap between laterally spaced apart metallic components in a circuit. U.S. Pat. No. 5,087,589 teaches of the creation of vertical conductive selected link regions after having performed ion implantation of the circuit.

Further, U.S. Pat. No. 5,585,490 is concerned with creating vertical links by connecting vertically spaced apart metal layers by exposing link points to a laser pulse. The use of lasers in the art in relation with integrated circuits is therefore mainly directed to the creation of conductive links and pathways where none existed before.

To accomplish the creation of conductive links between metal connectors, the prior art teaches the use of lasers capable of delivering a high intensity laser pulse. The heating action of the high-powered laser pulse cause breaks and fissures to appear in the silicon oxide (or other insulator) spacing apart the metal lines. The heating action of the laser pulse further causes some of the metal of the connectors to melt, which melted metal infiltrates into the fissures and cracks in the insulator, thus creating a link between the two connectors. The methods taught in the above patents therefore requires the application of a single, powerful laser pulse. Following the application of the since laser pulse, no further laser pulse is applied. Therefore, these patents are concerned only with the creation of low resistance links, i.e. laser diffusable links, and not with in any way accurately modifying the impedance across a given device.

Modifying the impedance or resistance of integrated semiconductor devices through the use of lasers is however known in the art. Such methods, sometimes known as laser trimming of integrated semiconductor devices is most often performed on a semiconductor device having a resistive thin film structure, manufactured with materials such as silicon cliromide, cesium silicides, tantalum nitride or nichrome. The trimming of the integrated semiconductor device, in order to achieve a required or desired resistance value is obtained by laser ablation, (i.e. by evaporation, or burning off), of a part of the resistive thin film. In other word, the laser is used to evaporate a portion of a resistive thin film structure, which due to the change in the amount of resistive thin film that remains, causes a change in the resistance value of the integrated semiconductor device.

This method comprises a number of disadvantages and limitations. One of the principal limitation of this method is that the final resistance value of the resistive thin film after the laser ablation depends on the film material itself, the quantity of material that is removed (i.e. evaporated) through laser ablation, and the pattern or shape of the ablated area. Thus if a large resistance change is required, a large area needs to be ablated, which may not be possible with the very small scale of some integrated circuits. Thus conventional laser ablation techniques generally do not allow for flexibility in any required change of resistance or impedance once the circuit has been designed and built. A further severe limitations of laser ablation technology lies in the fact that the resistive value of the trimmed device after ablation may not remain constant, and may change with time. This resulting change of the resistance value of the resistive thin film with time, which may be known as resistance drift, may be caused by a long term annealing effect of the laser ablated area. This long term annealing or "aging" effect may result from a slow decrease in the size of the thin film crystallites and may cause, with time, a significant rise of the film resistance value. This change is highly undesirable, as it may, through time, bring about a deterioration of the integrated circuit characteristics, in a field where even small variations in characteristics may not be acceptable.

A further disadvantage of laser trimming is that the ablation itself(or evaporation) of the thin film may result in damage to the surrounding integrated device. For example, residual material from the evaporation process (i.e. the material which is itself ablated or evaporated) may splatter adjacent components of the circuit, and therefore damage them. Further, the laser power output required for the resistive thin film evaporation can, in some instances, affect adjacent circuit elements by causing thermal damage, and can consequently induce unexpected and unwanted dysfunction of the integrated semiconductor device.

Further, standard manufacturing processes of integrated circuits may not include resistive thin film manufacturing steps. Therefore, additional deposition steps may be required to manufacture resistive thin film, thus increasing cost and complexity of the integrated device. Further, in some cases, a passivation layer may need to be deposited on the circuit after the laser trimming process in order to protect the resistive thin film from surrounding chemical contamination. These additional steps necessitate the use of additional manufacturing processes and therefore corresponding increased costs.

A further important disadvantage of known or conventional laser ablation techniques for trimming integrated resistors is the relatively large size of the thin film resistors themselves required in order to be able to successfully perform the ablation. In fact, due to manufacturing tolerances and other constraints, the size of the thin film may have to be much larger than the actual area which is to be ablated by laser. This wasted area surrounding the laser ablated area drastically reduces the efficiency of the architecture of the integrated circuit. Not only are unnecessary costs incurred in additional silicon, but large dimensions impose major restrictions, especially for high frequency integrated circuit elements. As miniaturization is of tremendous importance in the semiconductor industry, and as manufactures and users require ever smaller and more dense devices, laser ablation for trimming the resistance of integrated circuits becomes uneconomical, impractical, if not impossible.

Finally, a further disadvantage of known laser ablation techniques for modifying the resistance of integrated resistors is that known conventional laser trimming techniques can only increase the resistance value of the film, in other words, the technique can only work in one direction by increasing the resistance of the resistors. Known laser ablation techniques cannot lower the resistance of integrated resistors, and it therefore follows that if during the trimming procedure, over-trimming occurs and the achieved resistance is too high for the required use, there is no way of reversing this and trimming the resistance downwardly. Overtiming of a circuit may therefore cause the whole circuit to be scraped. Further, the use of lasers or other focussed heat sources is unknown in the art to modify the impedance, i.e. increase or decrease the impedance of integrated semiconductor device.

SUMMARY OF THE INVENTION

It is therefore an object of the present invention to provide a method and apparatus for iteratively, selectively tuning the impedance of integrated semiconductor devices through the use of a focussed heating source, such as a focussed laser beam.

It is also an object of the present invention to provide a method and apparatus for iteratively, selectively tuning the impedance of integrated semiconductor devices through the use of a focussed heating source, wherein the method does not include the ablation or evaporation of a part of the integrated semiconductor device.

It is a further object of the present invention to provide a method of tuning the impedance value of an integrated semiconductor device by accurately modifying the dopant distribution profile of an area of low dopant concentration, by inducing therein controlled diffusion of dopants from one or more adjacent areas of higher dopant concentration, through the melting action of a series of heating pulses from a focussed heating source.

Another object of the present invention is to provide a method of selectively tuning the impedance value of integrated semiconductor devices manufactured on substrate materials which comprise silicon, gallium arsenide SiGe (Silicon-Germanium), III–V semi-conductor compounds, and II–VI semi-conductor compounds.

It is a further object of the present invention to provide a method of selectively upward tuning and/or downward tuning the impedance of integrated semiconductor devices.

A further object of the present invention is to provide a method of tuning integrated semiconductor devices which comprise two heavily doped regions spaced apart by a region of lower dopant concentration, the three (3) regions being contiguous.

Yet a further object of the present invention is to provide a method of tuning the resistance value of integrated semiconductor devices in which the duration of the heating pulses, the number of heating pulses, the power of the focussed heating source, the spot diameter of the focussed heating source, the position of the focussed heating source and the angle of application or alignment of the focussed heating source may be readjusted (as required) after each application of the heating source in order to reach the desired or required impedance value of the integrated semiconductor device.

Still another object of the present invention is to provide a method of tuning the resistance value of integrated semiconductor devices manufactured through any conventional CMOS or Bipolar manufacturing processes without requiring any additional manufacturing steps.

Yet another object of the present invention is to provide a method of tuning the resistance value of an integrated semiconductor device wherein the heating pulse is of a power sufficient to tune the resistance of the device, yet which avoids potential damage to surrounding elements of the device and ensures better stability and reliability of the circuits through time.

Yet another object of the present invention is to provide a method of tuning the resistance value of integrated semiconductor devices wherein the size of the integrated semiconductor devices are smaller than thin resistive films used for conventional laser trimming.

Therefore, the present invention, in accordance with a general aspect provides for:

a method for the iterative, controlled modification of the relative dopant distribution profile of a first doped region and of an adjacent second doped region of an integrated semiconductor device, wherein said second doped region has a lower dopant concentration than said first doped region, comprising the steps of directing a focussed heating source to a selected area which encompasses a portion of each of said first and second doped regions, applying at least one heating pulse to said selected area, wherein each said heating pulse melts said selected area, allowing said melted selected area to solidify between each successive application of said heating pulses wherein each said melting and solidifying cycle allows for the controlled diffusion of dopants from said portion of said first doped region to said portion of said second doped region.

The present invention in particular provides a method for the iterative, controlled modification of the relative dopant profile of a pre-selected region of a semiconductor component, said semiconductor component comprising two adjacent doped regions of different dopant concentration, said method comprising a) applying a tuning cycle to a pre-selected area which encompasses a portion of each of a first doped region and a second doped region having different dopant concentrations, said tuning cycle comprising the following steps i) a heating/cooling treatment comprising directing a pre-determined heating pulse, from a focussed heating source, for a pre-determined pulse duration sufficient to melt said preselected area and to alter the dopant profile of the pre-selected area and subsequent to said pulse allowing said melted pre-selected area to solidify with an altered dopant profile ii) determining the relevative dopant profile of said semiconductor component subsequent to said heating/cooling treatment and iii) comparing the relative dopant profile obtained from step ii) with a predetermined relevative dopant profile.

and b) if necessary, repeating said tuning cycle one or more additional times until said predetermined relative dopant profile is achieved.

In accordance with a further aspect of the present invention, there is provided for:

a method of iteratively and accurately tuning the impedance of an integrated semiconductor device through the controlled modification of the dopant distribution profile of a heavily doped region configured and disposed adjacent a lightly doped region comprising the steps of
  directing a focussed heating source to a selected area which straddles a portion of each of said lightly doped region and said heavily doped region,
    applying at least one heating pulses to said selected area, wherein each said heating pulse melts said selected area,
  allowing said melted selected area to solidify between each successive application of said heating pulses
wherein each said melting and solidifying cycle allows for the controlled diffusion of dopants from said portion of said heavily doped region into said portion of said lightly doped region.

The present invention in particular provides a method for the iterative, controlled modification of the impedance of a semiconductor component, said semiconductor component component comprising two adjacent doped regions of different dopant concentration, said method comprising
  a) applying a tuning cycle to a pre-selected area which encompasses a portion of each of a first doped region and a second doped region having different dopant concentrations, said tuning cycle comprising the following steps
    i) a heating/cooling treatment comprising directing a pre-determined heating pulse, from a focussed heating source, for a pre-determined pulse duration sufficient
      to melt said preselected area and
      to alter the dopant profile of the pre-selected area
    and subsequent to said pulse allowing said melted pre-selected area to solidify with an altered dopant profile
    ii) determining the impedance of said semiconductor component subsequent to said heating/cooling treatment and
    iii) comparing the impedance obtained from step ii) with a predetermined impedance
  and
  b) if necessary, repeating said tuning cycle one or more additional times until said predetermined impedance is achieved.
In accordance with a further aspect of the present invention, there is provided for:
  a method of iteratively and accurately tuning the impedance of an integrated semiconductor device comprising a first doped region spacing apart a second and third doped region, through the controlled diffusion of dopants from said second and third doped regions to said first doped region, comprising the steps of
    directing a focussed heating source to a selected area comprising at least a portion of said first doped region and at least a portion of each of said second and third doped regions,
    applying at least one heating pulse to said selected area, wherein each said heating pulse melts said portion of said first doped region and said portion of each of said second and third doped region,
    allowing said melted portions to solidify between each successive application of said heating pulses,
  wherein each said melting and solidifying cycle allows for the controlled diffusion of dopants from said portion of said second and third doped regions into said portion of said first doped region.

In accordance with an embodiment of the present invention, there is provided for a method of tuning (i.e. modifying, changing, adjusting, increasing, decreasing etc . . .) the impedance of an integrated semiconductor device through a series of continuous steps which cause the controlled diffusion of dopants from one or more areas having a dopant concentration (i.e. a higher concentration) to one or more areas of lower dopant concentration. It is understood that the expression impedance comprises both resistance and capacitance, and that modifying the impedance of an integrated semiconductor device is understood to comprise modifying the resistance and/or the capacitance of an integrate semiconductor device. The expression controlled diffusion is understood to mean that a careful, calculated and measured application of focussed energy is applied to the integrated semiconductor device, which may result in a controlled and/or determinable quantity of dopants being diffused from one area to an adjacent area having a lower dopant concentration, thus resulting in a change in the (relative) dopant concentration between two adjacent areas, and consequently, the impedance therebetween. Controlled diffusion may be opposed (i.e. distinguished) from maximum diffusion which results from the application of an indiscriminate pulse from a high powered laser (i.e. a blast of energy). Controlled diffusion of the present invention may therefore be distinguished from the maximum diffusion which is the method taught by the prior art. Therefore, the present invention teaches a method of modifying the impedance of an integrated semiconductor device by causing a change in the relative dopant concentration of two (or more) adjacent areas of said integrated semiconductor device, which change of the relative dopant concentration may be accomplished through a number of successive, iterative steps, each of which may cause the controlled diffusion of dopants from one or more areas of higher dopant concentration to one or more areas of lower dopant concentration. The local dopant concentration of one or more areas of an integrated semiconductor device may thus be selectively modified.

In accordance with an embodiment of the present invention, semiconductor devices may be tuned, which expression (tuned or tuning) is understood to mean that the impedance of the integrated semiconductor device may be modified, adjusted, changed, whether increased or decreased. It is further understood that in addition to tuning, the present invention may also call for fine tuning of an integrated semiconductor device, which is understood to mean that the impedance, once it has been grossly tuned, may also be finely tuned (i.e. finely adjusted, or with high precision). Fine tuning may involve a distinct series of steps in the method, or may be simply an additional step in the regular tuning process. In accordance with a general aspect of the present invention, the method disclosed herein does not, subsequent to the manufacture of the integrated semiconductor device, require any ion implantation step prior to the application of said first heating pulse.

In accordance with an embodiment of the present invention, the tuning of an integrated semiconductor device may be accomplished iteratively, i.e. through the use of an iteration technique or method. Thus, iteratively or iteration technique is to be understood to mean a process, action or procedure in which repetition of a sequence of operations yields results which are successively closer to a desired result. Therefore, the objectives of a particular embodiment of the present invention may be accomplished through the use of an iteration technique, by which the successive application of pules (i.e. one or more pulses) from a focussed heating source, may progressively yield a dopant profile which is progressively closer to the required or desired dopant profile across a given portion of an integrated semiconductor device. For example, a first laser application may result in 80% of the required impedance chance, a second laser application may result in 91% of the required impedance change, a third laser application may result in 98% of the required impedance change, a fourth laser application may result in 100% of the required impedance change. It is understood however that a greater or lesser number of laser applications may be required to achieve the required or desired impedance change, and it is further understood that the required impedance change may be achieved with as little as one or two laser applications.

In accordance with a general embodiment of the present invention, an integrated semiconductor device may comprise a number of components. Included among these may be areas which may be doped with dopants, such as for example, n type or p type dopants. The dopant concentration of various areas of a device may vary according to their use and application, and there may be, for example, areas of a given dopant concentration, and adjacent thereto there may be areas of higher or lower dopant concentration. In accordance with an embodiment, there may therefore be a first area of a dopant concentration, and an adjacent second area of a (relative) lower dopant concentration. As may be understood, the difference in the dopant concentration of the first and second areas may be sufficient such that the physical and electrical properties of each of the areas may be different, i.e. for example, one may conduct electrical current, while the other may not, or their relative capability to conduct electrical current may be different. The present invention therefore addresses a method for modifying the relative current carrying capacities of adjacent areas of an integrated semiconductor device by modifying the relative dopant concentration difference of said areas.

In accordance with a particular embodiment of the present invention, in order to modify the relative dopant concentration difference between a first doped area and a second doped area having a lower dopant concentration, the following iterative steps may be effected. Namely, a focussed heating source may be targeted at a selected area, which selected area may comprise therein a portion of the first doped area, and a portion, or all of the second doped area, i.e. the selected area may straddle the boundary between the first and the second doped areas. As may be understood, the selected area may be generally round, and may or may not evenly straddle the boundary between the first and the second doped region. Once the selected area has been targeted, there may be applied to the selected area a first (heating) pulse from a focussed heating source, which heating pulse may cause the selected area to melt. As may be understood, portions of the first doped area and portions of the second doped area which are outside of the selected area may also be caused to be melted by the application of the heating pulse.

Once the first heating pulse has been applied, the selected area may be melted, i.e. may be made to change from the solid stated to the liquid state. The period during which the selected area may be melted may be very short, i.e. of the order of 10 femtosecond to 10 microseconds long. This very short period of time during which the selected area may be melted may however be sufficient to allow the diffusion (i.e. migration) of dopants from the first area to the second area of lower dopant concentration. The diffusion of dopants from an area of higher dopant concentration to an area of lower dopant concentration occurs in accordance with well known principles. The (controlled) diffusion may therefore take place very rapidly, such that even during the short time during which the selected area may be melted, sufficient dopants may diffuse which may cause an appreciable change in the dopant concentration of the area of lower dopant concentration.

As mentioned, the melted area may only remain in a liquid state for a short period of time, i.e. for a period of time substantially the same as the length of application of the heating pulse. Once the selected melted area has solidified, the dopant profile of the selected area may therefore have been modified, and may therefore be of a concentration which is intermediate the dopant concentration of the first area and the second area of lower dopant concentration.

Once the preceding step has been accomplished, further steps in the iterative process may be undertaken. For example, the next step may comprise the determination, i.e. the testing of the new impedance of the integrated semiconductor device achieved as a result of the application of the first heating pulse. This testing may be conducted in accordance with any known or desired method, and the results may be compared with the required or desired end result.

Depending on the impedance value of the integrated semiconductor device achieved as a result of the prior iterative steps and depending on the final impedance which is required or desired, it may be necessary to perform a further iterative step of the method. For example, if the impedance has not been sufficiently decreased, a further application of a focussed heating source may be made to the selected area in order to further decrease the impedance. Namely, the application of a further (i.e. second) focussed heating source may further melt (all, or part of) the selected area of the integrated semiconductor device, thus causing further diffusion of dopants from the first area to the second area of lower dopant concentration, as described above.

Once the melted area has once more solidified, a further step in the iterative process may involve the re-testing of the resulting impedance and the comparison of this resulting impedance with the required desired result. If the resulting impedance is still not what is required or desired, a further iterative step may be performed similar to the process as described above.

As may be understood, in accordance with an embodiment of the present invention, the iterative process involves in its most general form the application of a heating pulse which may cause a modification in the relative dopant concentration of two (or more) adjacent and abutting areas of an integrated semiconductor device, the testing of the impedance resulting from the application of said heating pulse, and if required or desired, the repeat of steps one and two. As may be further understood, subsequent to the determination of the resulting impedance following the application of a heating pulse, some or all of the characteristics of the subsequent heating pulse or pulses may be modified, i.e. adjusted. The characteristics of the heating pulses which may be modified are varied, and may depend on how much of a further modification of the impedance the next application of the heating pulse is required to achieve. Thus, for example, if after the application of one heating pulse, it is determined that the impedance has reached a substantial percentage of the required result, the characteristics of the next focussed heating pulse may be modified, as an example, the power of the focussed heating source may be decreased. As a further example, the length of the application of the heating pulse may be decreased, the diameter of the beam of the heating pulse may be decreased, all in order to bring the impedance as close as possible to a required result. Further, the location of the application of the heating source may be displaced, (i.e. another selected area may be used) and further, the angle of application of the heating source may be varied, i.e varied from a 90° angle application. In addition, a different heating source may also be employed. Subsequent to the application of a modified heating pulse, if the integrated semiconductor device is further tested and it is determined that, for example, substantially all of the required or desired impedance change has been achieved, the characteristics of the heating pulse may be further modified, i.e. the power of the heating pulse may again be further reduced, the length of application of the heating pulse may also be further reduces etc. . . . It is however possible that the characteristics of any of the subsequent heating pulses may be increased for a subsequent application, i.e. some or all of the power of the heating pulse, the length of application, the spot diameter etc. . . . may be increased. In other words, not all of the applied heating pulses may be identical, however it is foreseen that as the impedance is iteratively brought closer to the desired end-value, the characteristics of the focussed heating source may be decreased, or lowered.

In accordance with an embodiment of the present invention, there may be provided for an integrated semiconductor device which may be configured and disposed such that it comprises, for example, two (2) areas of higher dopant concentration which are spaced apart by an area of a lower dopant concentration. Thus the area of lower dopant concentration may act as an insulator, between the two (2) areas of higher dopant concentration. In this configuration, the dopant concentration of the area of lower dopant concentration may be low enough such that no electrical current or a very low amount of electric current may flow therethrough. Alternatively, the two (2) areas of higher dopant concentration may be spaced apart by an area of lower dopant concentration, which area of lower dopant concentration may allow for the passage therethrough of some (for example, minimal) electric current. It is understood that for some electrical current pass through an area of lower dopant concentration disposed between two (2) areas of higher dopant concentration, it is necessary that the type of dopant in the three (3) areas be identical, i.e. either all of n type, or all of p type. In accordance with this embodiment, the method of the present invention may be used to modify the dopant concentration thereof, therefore increasing or decreasing the preexisting impedance of any part of an integrated semiconductor device. Therefore, in accordance with an embodiment of the present invention, the use of the method of the present embodiment may allow for the impedance of an integrated semiconductor device to be modified such that some electrical current (i.e. as opposed to no electrical current) may be able to flow. Further, the present method may also be used to allow more electrical current to flow than what may previously have been able to flown through. Alternatively, the method of the present embodiment may allow for the impedance to be modified such that less electrical current may be allowed to flow through. Further, the method may even modify the impedance such that no (or almost no) electrical current (i.e. no further electrical current), may be able to flow therethrough.

The type of dopant (or dopants) used in the lightly (i.e lower) doped region may not be the same as the type of dopant use in the heavily (i.e. higher) doped regions. For example, if the heavily doped region uses a p type dopant, the lightly doped region can be either p type or n, and vice versa. It is understood that if the lightly doped region and the heavily doped region are each doped with the same type of dopant, then at very low dopant concentration, the lightly doped region may conduct some (i.e. minimal) amount of electrical current. It is understood however, that the integrated semiconductor device may also comprise heavily doped regions which may be doped with one type of dopant (i.e. n type dopant), and that the lightly doped region may be doped with a different type of dopant(i.e. p type dopant). In accordance with this embodiment, the amount of dopant to be diffused from the area (or areas) of higher dopant concentration into the area of lower dopant concentration may be high enough to counter the presence of the different type of dopant present in the lightly doped area, such that current may flow through said lightly doped area. The level of concentration of the dopants in the areas of high and low concentration may vary significantly. For example, the dopant concentration may vary between $10^2$ to $10^{20}$ atoms per $cm^3$. The range of dopant concentration for a lightly doped area may, for example, be between $10^{12}$ to $10^{16}$ atoms per $cm^3$ while the dopant concentration for an area of high dopant concentration may, for example, be between $10^{16}$ to $10^{20}$ atoms per $cm^3$. It is understood that the terms lightly doped region and heavily doped region are not meant to exclude a first doped region which dopant concentration is only slightly higher than a second doped region. The dopants which may be used in accordance with the present invention may be selected from the group comprising boron, phosphorus, aluminium, antimony, arsenic, gallium, indium, lithium, thallium and bismuth. The dopants may be doped in a substrate comprising a material selected from the group comprising silicon, gallium arsenide, silicon-germanium, compounds selected from columns III–V and II–VI of the periodic table, and compounds having a IV—IV alloy.

The focussed heating source which may be used in accordance with the present invention may be selected from a group comprising a laser and an electron beam. Further, the energy of the heating pulses of said focussed heating source may be low enough to avoid damaging the integrated semiconductor device.

In accordance with a further embodiment of the present invention, there is provided for:
   a method of iteratively, selectively and accurately tuning the impedance of an integrated semiconductor device by controlled diffusion of dopants from a first region having a first dopant concentration to an immediately adjacent second region having a lower dopant concentration than said first region comprising the steps of:
   directing a focussed heating source to a selected area which straddles a portion of
   each of said first region and said second region, and
   applying a heating pulse from said focussed heating source thereto,
     wherein said heating pulse melts said selected area thereby allowing the controlled diffusion of dopants from said first region to said second region,
   allowing said melted selected areas to solidify, said solidified selected area now being a third region having a dopant concentration which is intermediate the dopant concentration of said first region and said second region,
   measuring the impedance of said semiconductor device to determine if said impedance
   is either higher than required, or lower than required,
and if said impedance is higher than required,
   then directing said focussed heating source to a portion of said first region
   adjacent to said third region and applying a heating pulse thereto, wherein said heating pulse melt said portion of said first region and further melts said adjacent third region thereby allowing for the controlled diffusion of additional dopants from said melted portion of said first region to said melted third region, and allowing said melted areas to solidify, or if said impedance is lower than required, then directing said focussed heating source to a portion of said second region adjacent to said third region and applying a heating pulse thereto, wherein said heating pulse melts said portion of said second region and further melts said adjacent third region thereby allowing for the controlled diffusion of dopants from said third region to said melted portion of said second region, and allowing said melted areas to solidify, and repeating the iterative steps until the desired impedance of said integrated semiconductor device is achieved.

In accordance a further embodiment of the present invention, there is provided for a method of selectively upwardly or downwardly tuning the impedance of an integrated semiconductor device. For example, in an integrated semiconductor device comprising a first and second doped region which are spaced apart by a third doped region having a lower dopant concentration then either of the first or second doped regions, the iterative steps as described above may bring about a change in the dopant concentration of said third doped region. However, if it is determined (i.e. measured) that the dopant concentration of this third doped region is not what was required, i.e. it is now too high, namely that one or more too many iterative steps have been applied, then the dopant profile across the regions may not be usable. Normally, the overly great diffusion of dopants into said third doped region could have been problematic, however, in accordance with this further embodiment of the present invention, the dopant concentration of said third doped region may be selectively modified, i.e. lowered. This may be accomplished by pointing a focussed heating source to a selected area which straddles all or part of the third doped region and an adjacent region thereof having a lower dopant concentration, and applying an heating pulse thereto. The heating pulse may therefore melt all of or a portion of said third region and the adjacent area of lower dopant concentration. This melting may therefore cause diffusion of the dopant from said third region to said region of lower dopant concentration, due to well known physical phenomena. The diffusion of dopants may therefore be sufficient to lower the dopant concentration in said third region, which may therefore achieve the required dopant profile across the first, second and third regions. This further iterative step may be accomplished any number of times in order to achieve the proper dopant concentration in the third region. As may be understood, this additional embodiment therefore allows for greater flexibility in the modification of the dopant concentration of a integrated semiconductor device, by allowing mistakes to be corrected or rectified.

In accordance with yet a further embodiment of the present invention, there is provided for a:

tunable integrated semiconductor device adapted for controlled, selective iterative tuning comprising a first doped region, a second doped region, and a third region having a dopant concentration which is less than the dopant concentration of either of said first or said second doped regions, said third region being configured and disposed such that it is adjacent to each of said first doped region and said second doped region, at least one of each of said first doped region and said second doped region comprising a projection disposed projecting into said third region.

In accordance with yet a further embodiment of the present invention, there is provided for a:

tunable integrated semiconductor device adapted for controlled, selective iterative tuning comprising first and second principal tuning arms, said first and second principal tuning arms being spaced apart by a region of lower dopant concentration than the dopant concentration of either of said first and second principal tuning arms, third and fourth secondary tuning arms, said third and second tuning arms being spaced apart by a region of lower dopant concentration than the dopant concentration of either of said third and fourth secondary tuning arms, said third secondary tuning arm being configured and disposed so as to be connected to said first principal tuning arm, and said fourth secondary tuning arm being configured and disposed so as to be connected to said second principal tuning arm.

BRIEF DESCRIPTION OF THE DRAWINGS

The following invention may be further understood from the following detailed description, with reference to the drawings in which.

DETAILED DESCRIPTION OF THE DRAWINGS

Figure 1:
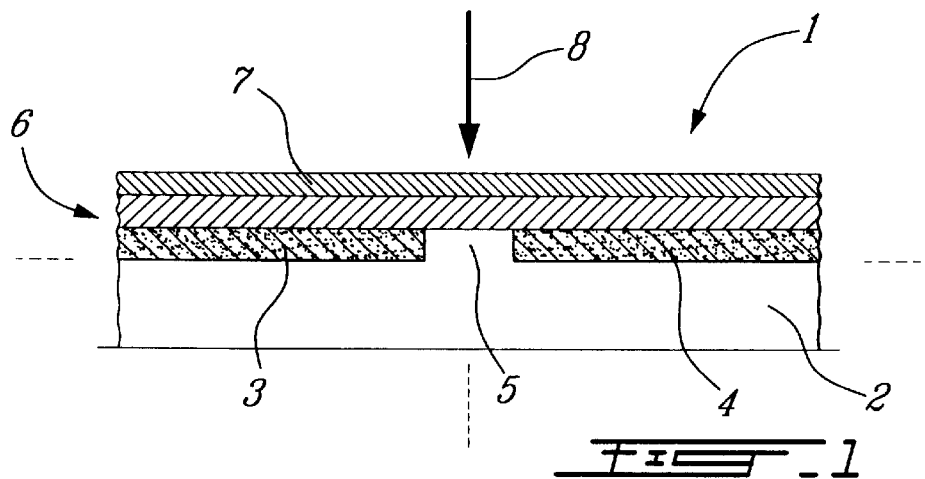
FIG. 1 illustrates a cross-sectional view of a tunable integrated semiconductor device showing a step in the method in accordance with an embodiment of the present invention.

FIG. 1 illustrates a cross-sectional view of a tunable integrated semiconductor device 1 in accordance with an embodiment of the present invention. The tunable integrated semiconductor device 1 may comprise various layers, for example, a substrate 2, which substrate 2 may comprise semiconductor materials such as silicon, germanium, gallium arsenide, silicon-germanium or other suitable semiconductor materials selected from a group comprising elements from columns III–V, or columns II–VI of the periodic table, or compounds having a IV—IV alloy. The tunable integrated semiconductor device may comprise two or more heavily doped regions, illustrated in FIG. 1 as heavily doped regions 3 and 4. As may be understood, heavily doped regions 3 and 4 may be heavily doped with either n or p type dopants in sufficient concentrations, and of a required or desired profile such that said heavily doped regions 3 and 4 may be electrically conductive. For example, the dopants may be phosphorous, and may be of a concentration of the order of between 1016 to 1020 atoms per $cm^3$. The thickness of the heavily doped regions may for example be of 0.25 micrometers, but may be greater or lesser in accordance with the requirements of a given manufacturing process. Further, the configuration and disposition of the heavily doped regions may also be in accordance with the requirements of a given manufacturing process.

The tunable integrated semiconductor device 1 may further comprise a lightly doped region 5 disposed intermediate the heavily doped regions 3 and 4. Lightly doped region 5 may be doped with the same dopant as the heavily doped regions 3 and 4, or alternatively, may comprise a different dopant than that present in the adjacent heavily doped regions 3 and 4. Lightly doped region 5 may be disposed to be adjacent to and abutting heavily doped regions 3 and 4. The type and concentration level of dopants in lightly doped region 5 may be such that, prior to the application of the method steps in accordance with an embodiment of the present invention, no electrical current may flow between heavily doped regions 3 and 4, i.e. wherein the resistance of lightly doped region is high enough to prevent (most if not all) electrical current to flow between heavily doped regions 3 and 4. As may be understood, if the type of dopant of the lightly doped region is different from the type of dopant of the heavily doped region, the device will be equivalent to two (2) diodes in opposite polarity which will not allow any electrical current to pass therethrough. Alternatively, if the same type of dopant is used in regions 3 and 4, as well as in region 5, the concentration level of dopants in lightly doped region 5 may be such that some electrical current may be able to flow between heavily doped regions 3 and 4, i.e. that the resistance of lightly doped region 5 may not be so high so as to stop all electrical current from flowing therethrough. In accordance with this embodiment, the method steps may be used to modify, i.e. lower or raise the resistance of lightly doped region as required. As shown in FIG. 1, the integrated semiconductor device is shown as comprising a passivation layer 7, such as silicon nitride $Si_3N_4$. Further, the device is also shown as comprising oxide layer 6, such as silicon dioxide $SiO_2$.

As further shown in FIG. 1, arrow 8 depicts the direction of application of a focussed heating source pulse onto the semiconductor device 1. As may be understood, a focussed heating source may be disposed (not shown) above the integrated semiconductor device 1, and which may apply a pulse 8 to the device 1. As may be understood, the dimensions of the pulse 8 and of the device may not be to scale.

Figure 2:
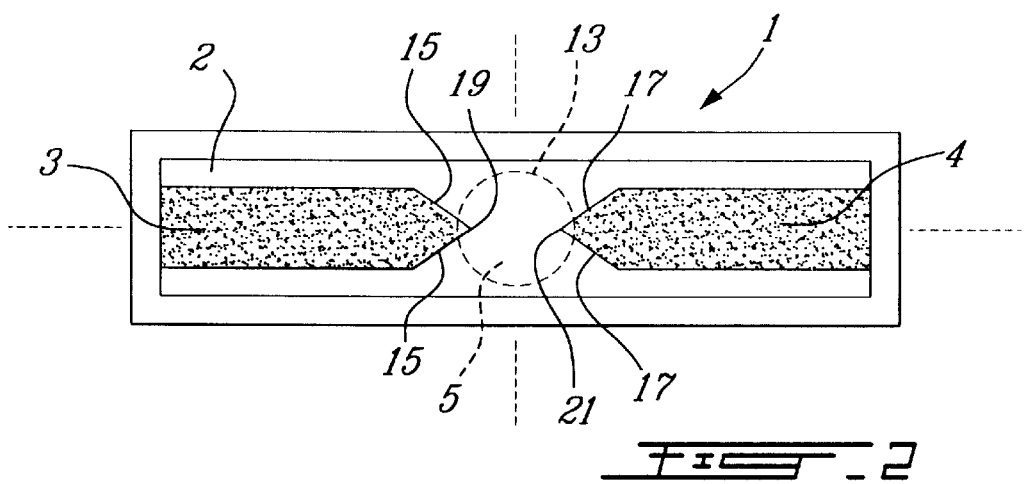
FIG. 2 illustrates a top plan view of the tunable integrated semiconductor device as shown in FIG. 1.

As illustrated in FIG. 2, lightly doped region 5 may be disposed roughly intermediate to, and spacing apart heavily doped regions 3 and 4. Lightly doped region 5 may be a separate region (with its own dopant concentration, and other characteristics) spacing apart heavily doped regions 3 and 4, or alternatively, may be simply part of substrate 2. Further, lightly doped region 5 may be configured and disposed such that boundary edges 15 and 17 of heavily doped regions 3 and 4 respectively may be in direct contact with lightly doped region 5. The boundary edges 15 and 17 are shown as being a straight line, i.e. in a plane, but it is understood that said boundary edges 15 and 17 may be curved, inclined etc. . . The configuration and disposition of heavily doped regions 3 and 4, as well as that of lightly doped region 5 may encompass a number of different geometries. For example, FIG. 2 illustrates a configuration wherein heavily doped regions 3 and 4 each have a pointed tip geometry, wherein the narrow end of each tip 19 and 21 respectively, is pointed towards the other tip. It is understood however, that since the configuration and disposition of heavily doped regions 3 and 4, as well as that of lightly doped region 5 is to be such so as to allow a better control of the dopant that migrates from heavily doped regions 3 and 4 into lightly doped region 5, the respective geometries of regions 3, 4 and may alternatively, comprise any number of different configurations. The respective geometries of regions 3, 4 and 5 may also be selected to allow for a better control of the change in the impedance between heavily doped regions 3 and 4.

Figure 3:
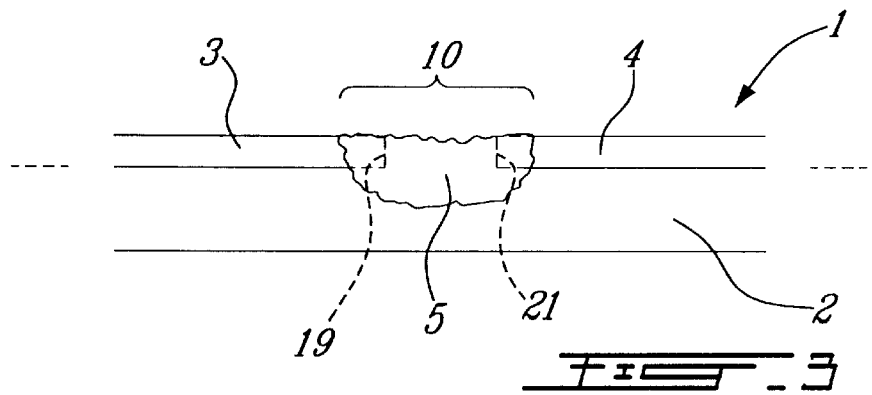
FIG. 3 illustrates a cross-sectional view of the tunable integrated semiconductor device as shown in FIG. 1, wherein following the application of the heating pulse of FIG. 1, a portion of the tunable integrated semiconductor device is shown to be melted.

Turning to FIG. 3, there is shown a cross sectional view of the tunable integrated semiconductor device 1 as shown in FIGS. 1 and 2. The application of a focussed heating pulse 8 (as illustrated in FIG. 1) may have caused a portion of lightly doped region 5, as well as adjacent portions 19 and 21 of heavily doped regions 3 and 4 respectively (shown in dotted lines), to melt. The melted areas may be known as a melted pool 10. In the embodiment illustrated by FIG. 3, a portion of heavily doped regions 3 and 4 is shown to be included in the melting pool 10. The extent of heavily doped regions 3 and 4 which will melt subsequent to the application of the heating pulse 8 (as shown in FIG. 1) may depend on the characteristics of the heating pulse, namely the power of the pulse, the duration of the application of the pulse, the diameter of the pulse, etc. . . For example, the diameter of the heating pulse may encompass a portion of one or both of heavily doped regions 3 and 4, or alternatively, the diameter of the focussed heating source may only be wide enough to encompass lightly doped region 5. The longer melted pool 10 is melted, the greater the diffusion of dopant from heavily doped regions 3 and 4 into lightly doped region 5. However, the amount of dopants which will diffuse from heavily doped regions 3 and 4 into lightly doped region 5 may also depend on how much of heavily doped regions 3 and 4 may be caught by the focussed heating beam 8, i.e. if a large part of heavily doped regions 3 and/or 4 are caused to be melted, more dopants may diffuse, and if a small part is caused to be melted, fewer dopants may diffuse. Depending on the length of time that melting pool 10 remained melted, the dopant profile across melted pool 10 from heavily doped region 3 to heavily doped region 4 may not be uniform.

Figure 4:
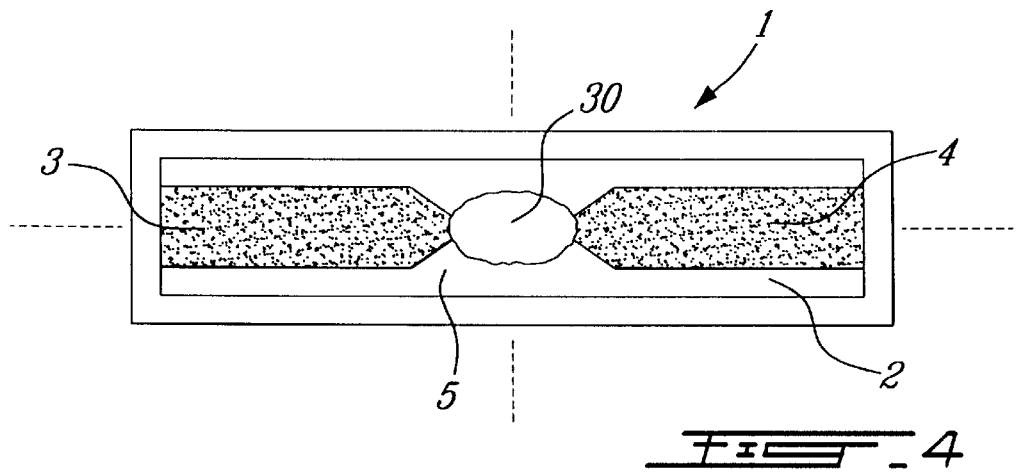
FIG. 4 illustrates a top plan view of the tunable integrated semiconductor device following the solidification of the melted portion of the tunable integrated semiconductor device of FIG. 3.

Turning to FIG. 4, there is shown a top plan view of the tunable integrated semiconductor device 1 following the solidification of the melted pool 10 as shown in FIG. 3. As may be understood, melted pool 10 (of FIG. 3) has now been transformed into region 30, which region has an intermediate dopant concentration, i.e. which dopant concentration is intermediate the dopant concentration of heavily doped regions 3 and 4, and dopant concentration of lightly doped region 5. As may be understood, since during the time that the melted pool 10 was melted, a certain quantity of dopants from heavily doped region 3 and heavily doped region 4 were able to diffuse into lightly doped region 5, and following the solidification of this melted pool 10, intermediate region 30 may now have a different dopant concentration from either of heavily doped region 3, heavily doped region 4, or lightly doped region 5. As may be seen, intermediate doped region 30 is roughly a circle in shape, which roughly mirrors the shape of the selected area 13 of FIG. 2 where the focussed heating source was applied.

Figure 5:
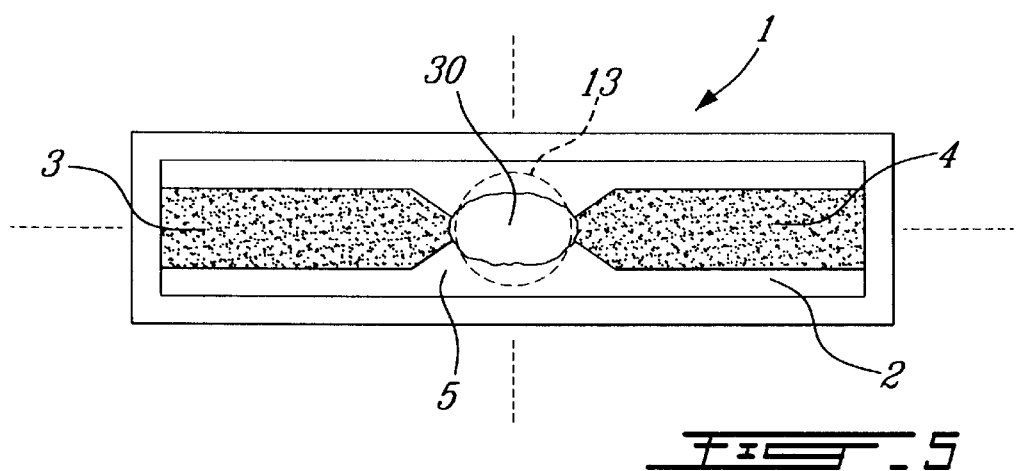
FIG. 5 illustrates a top plan view of the tunable integrated semiconductor device of FIG. 4 showing a further step in the method in accordance with an embodiment of the present invention.

Turning to FIG. 5 there is shown a top plan view of the tunable integrated semiconductor device of FIG. 4 showing a further steps in the method in accordance with an embodiment of the present invention. As may be seen, intermediate doped region 30 is superimposed by a further selected area 13, which selected area 13 is subject to a further application of a focussed heating pulse 8 as shown in FIG. 1. As may be understood, the application of focussed heating source 8 may cause most, if not all, of intermediate doped region 30 to melt, and further, portions of heavily doped regions 3 and 4 and portions of lightly doped region 5 may also be caused to melt. This new round of melting may incur further diffusion of dopants from the now melted areas of heavily doped regions 3 and 4, into intermediate doped region 30. Following the solidification of intermediate doped region 30, the dopant concentration of intermediate doped region 30 will be different from the dopant concentration of heavily doped region 3, heavily doped 4, and lightly doped region 5, and will further be of a different dopant concentration than the intermediate doped region 30 as previously shown in FIG. 4.

As may be understood, the iterative method steps shown in FIGS. 1 to 5 may be repeated any number of required or desired times in order to achieve the final required or desired dopant profile in intermediate doped region 30. Thus if a high dopant concentration is required in intermediate region 30, the iterative steps may be repeated a number of times, for an example 5 to 15 times, such that a maximum amount of control diffusion can occur. Conversely, if a low dopant concentration is required in intermediate doped region 30, the iterative steps as described in FIGS. 1 to 5 may be performed, for example, only once or twice, and therefore the impedance of intermediate doped region 30 may be high, and the dopant concentration may be low in comparison to the dopant concentration of heavily doped regions 3 and 4.

Figure 6:
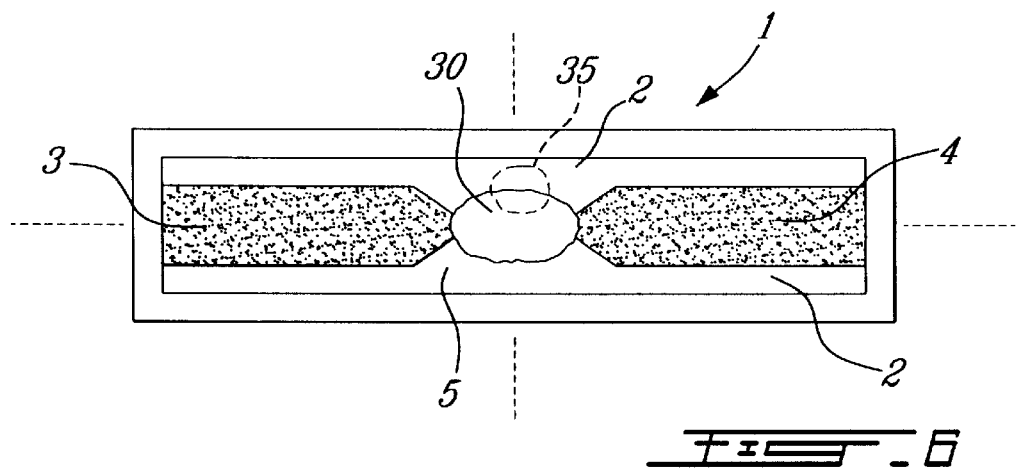
FIG. 6 illustrates a top plan view of the tunable integrated semiconductor device showing a further step in the method in accordance with an embodiment of the present invention.

Turning now to FIG. 6, there is shown a top plan view of a further step in the method of selectively tuning the impedance of an integrated semiconductor device. Selectively tuning the impedance of an integrated semiconductor device is understood to mean that the impedance may be increased, or may be decreased, depending on the requirements of the application. For example, if in accordance with an embodiment of the present invention, the impedance of an integrated semiconductor device is decrease past the target figure, it is possible to increase the impedance thereof in order to bring it into line with what is required. FIG. 6 for example illustrates this particular embodiment in accordance with the present invention wherein the impedance, after having been modified in one direction, (i.e. after the impedance of the integrated semiconductor device has been decreased through the method steps illustrated in FIGS. 1 to 5), it is now required that the impedance of the integrated semiconductor device be increased. T his may be as a result of the impedance having been lowered too much through the previous iterative method steps as illustrated in FIGS. 1 to 5, i.e. wherein the desired final impedance has been overshot, and it is now required to increase the impedance of the device.

The method illustrated in FIG. 6 may alternatively serve to modify (i.e. increase) the impedance of an integrated semiconductor device independently of the method steps illustrated in FIGS. 1 to 5. For example, if once an integrated semiconductor device is in service, it is determined that said device may need to be modified to suit a new or different application, the method illustrated in FIG. 6 may be used to increase the impedance thereof.

The integrated semiconductor illustrate in FIG. 6 therefore may comprise heavily doped regions 3 and 4 and lightly doped regions 5 and 2. In addition, intermediate doped region 30 may be disposed spacing apart heavily doped regions 3 and 4 and is further abutting each of said heavily doped regions 3 and 4. Intermediate doped region 30, may have a dopant concentration that is lower than the concentration of either of the heavily doped regions 3 and 4. In any event, the dopant concentration of intermediate doped region 30 may be greater than the dopant concentration of lightly doped regions 2 and 5. Thus, in accordance with a particular embodiment of the present invention, if it is desired or required to increase the impedance of intermediate doped region 30 this may be accomplished by creating the conditions necessary for dopants to diffuse from intenmediate doped region 30 into lightly doped regions 2 or 5. By accomplishing this transfer of dopants out of intermediate doped region 30, the electrical current carrying capacity of intennediate region 30 may therefore be reduced, thus increasing the impedance between heavily doped regions 3 and 4.

Therefore, in order to accomplish this particular embodiment of the present invention, a focussed heat source may be trained upon the integrated semiconductor devices such that said focus heating source may cover some or all of the intennediate doped region 30 and an immediately adjacent region of lightly doped region 5 or 2, said region being a selected area designated by reference number 35. Thus as may be understood, the application of a focussed heating source 8 (as shown in FIG. 1) may cause the melting of all or a portion of selected area 35, which may comprise all or a portion of intennediate doped region 30 and at the same time cause the melting of an immediately adjacent region of lightly doped regions 2 (or 5). During this time where selected area 35 is melted, the dopants present in intermediate doped region 30 (which concentration is higher than the concentration of the dopants in lightly doped region 2) may, through the well known and understood process of diffusion, diffuse from the intermediate doped region 30 into lightly doped region 5. The result will be a net lost of dopants from the intermediate doped region 30 into the lightly doped region 5, therefore reducing the number of dopants available in the intermediate doped region 30 to carry an electric charge therethrough.

It is understood that in accordance with this particular embodiment of the present invention, the selected area 35 may preferably not include a portion of either of highly doped regions 3 and 4.

Once these steps as described above have been accomplished, and the diffusion of dopants has occurred from intermediate doped region 30 to lightly doped region 5, the impedance of the integrated semiconductor device may be tested in order to determine whether sufficient diffusion of dopants away from intermediate doped region 30 has occurred. If it is determined that the impedance has not been modified a required or desired amount, the iterative steps described above may be repeated such that further dopants from the intermediate doped region 30 may be made to diffuse away from said intermediate doped region 30 into lightly doped region 5. Alternatively, if subsequent to the testing of the device it is determined that too much dopant has diffused from intermediate doped region 30 into lightly doped region 5, i.e. that the impedance of the integrated semiconductor device is now too high and it is now wished to reduce said impedance, the steps as illustrated in FIGS. 1 to 5 may be repeated.

Figure 7:
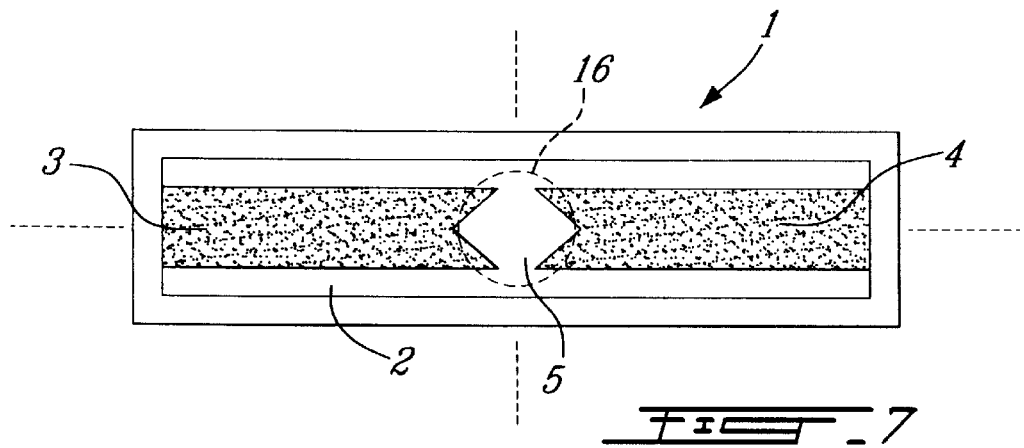
FIG. 7 illustrates a top plan view of an alternative embodiment of the tunable integrated semiconductor device of the present invention.
Figure 8:
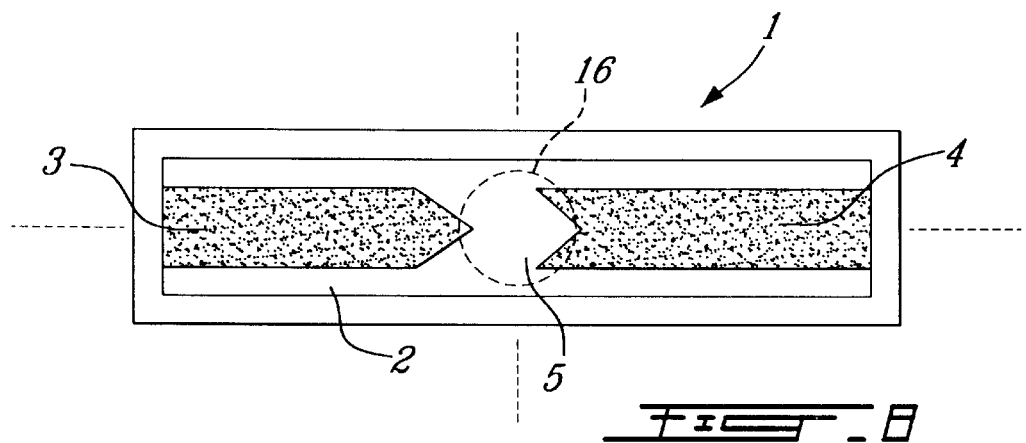
FIG. 8 illustrates a top plan view of a further alternative embodiment of the tunable integrated semiconductor device of the present invention.

Turning to FIGS. 7 and 8 there is shown a top plan view of an alternative embodiment of the tunable integrated semiconductor device I of the present invention. In particular, as illustrated in FIG. 7, heavily doped regions 3 and 4 are shown as each having a notched configuration pointing towards the other. In accordance with this configuration, the melted pool 16 which will occur as a result of the application of a focus heating source 8 (as shown in FIG. 1) may encompass more areas of heavily doped regions 3 and/or 4 and therefore may allow for a faster and more controlled diffusion of dopants from heavily doped regions 3 and 4 into lightly doped region 5. Further, the device as shown in FIG. 7 may facilitate the creation of devices having a symmetrical dopant distribution characteristics. As also illustrated in FIG. 8, there is shown a further alternative configuration of the integrated semiconductor device wherein heavily doped region 3 comprises a pointed arrow configuration and heavily doped region 4 comprises a notched configuration. Turing to FIG. 9 there is shown an alternative configuration of a tunable integrated semiconductor device 1. In accordance with this particular embodiment of the present invention, the device comprises first principal tuning arm 50 second principal tuning arm 51 third secondary tuning arm 54 and fourth secondary tuning arm 55. Spacing apart first and second principal tuning arms 50 and 51 is a lightly doped region 52; spacing apart third and fourth secondary tuning arms 54 and 55 is a further lightly doped region 53 which lightly doped region 53 and lightly doped region 52 may be of different size and configuration. Thus in accordance with this particular embodiment, the difference between the dopant concentration of lightly doped regions 52 and the dopant concentration of first and second principal tuning arms 50 and 51 is such that no electrical current may flow therethrough; further, the difference between the dopant concentration of lightly doped region 53 and the dopant concentration of third and forth secondary tuning arms 54 and 55 may be such that no electrical current may flow therethrough.

Figure 9:
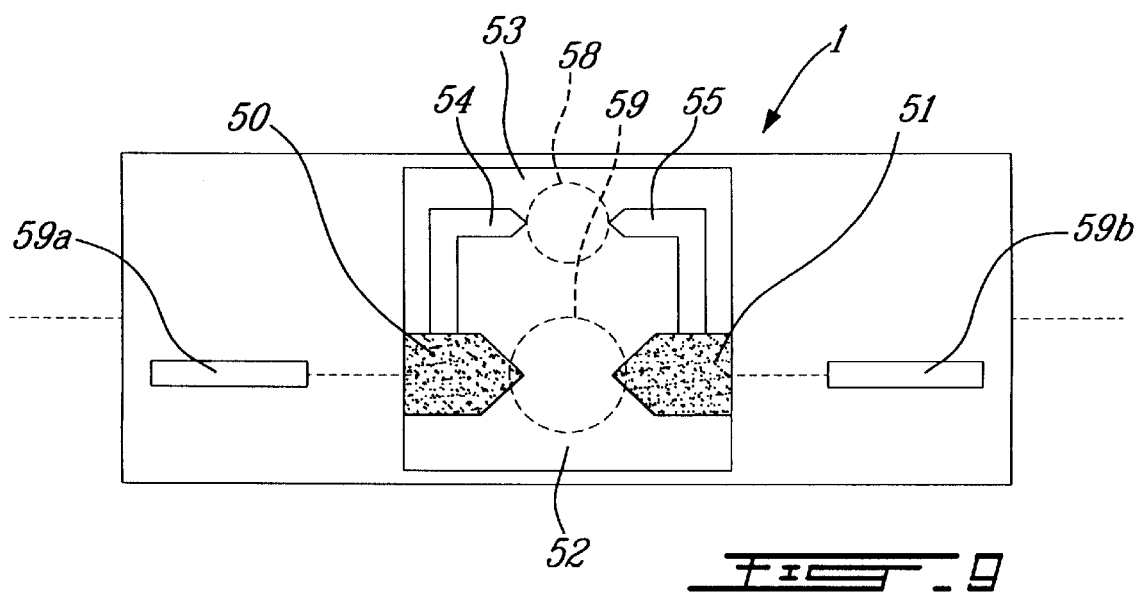
FIG. 9 illustrates a top plan view of another alternative embodiment of the tunable integrated semiconductor device of the present invention.

As may be seen from the illustration of FIG. 9, this particular embodiment comprises different sized tuning arms, and therefore, different capacity for carrying electrical current. As may be understood, the principal tuning arms 50 and 51 may be used as gross tuning arms and the third and forth secondary tuning arms 54 and 55 may be used as fine tuning arms. The expression fine tuning is understood to mean that (very) precise impedance changes may be achieved thereby. It is further understood that in addition to secondary tuning arms 54 and 55, there may also be one or more additional pairs of secondary tuning arms (not shown), which each additional pair of secondary tuning arms may further increase the precision tuning capability of the integrated semiconductor device. Thus for example, if a large change in the impedance of the integrated semiconductor device is required, there may applied a focussed heating source in region 59, as more fully described above. As a result of the diffusion of the dopants from heavily doped regions of the principal tuning arms 50 and 51 respectively, the impedance across first and second principal tuning arms 50 and 51 may be modified in accordance with the iterative method as described above. If, after testing of the resulting impedance, it is determined that a further adjustment of the impedance across the integrated semiconductor device is required, a further application of a heating pulse may be made to region 52, i.e. either with the same characteristics of the heating pulse (i.e. power, duration of application, etc. . .), or with different characteristics.

Alternatively, rather then applying a further laser pulse to region 52, the option exists to apply a focussed heating source to region 58. This heating pulse may have the same characteristics as the pules(s) applied to region 52, or may have different characteristics. Seeing that third and fourth secondary tuning arms 54 and 55 are much smaller then the principal tuning arms 50 and 51, the quantity of dopants which may be made to diffuse into lightly doped region 58 may be smaller, thus allowing for better controlled diffusion. The combined action of the change of impedance across first and second principal tuning arms 50 and 51 and across third and fourth secondary tuning arms 54 and 55 is such that the resulting overall changing in the impedance across the integrated semiconductor device may be more accurately controlled. As may further be seen, the integrated semiconductor device furhter comprises serial resistors 59*a* and 59*b*.

Figure 10:
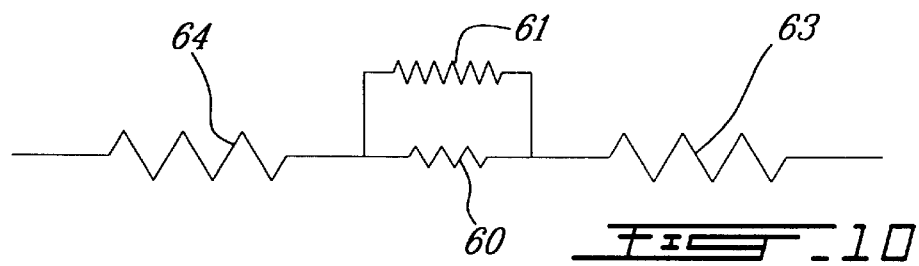
FIG. 10 illustrates an electric schematic drawing of the tunable integrated semiconductor device illustrated in FIG. 9.

As illustrated in FIG. 10, there is shown an electric schematic drawing of the integrated semiconductor device as illustrated in FIG. 9. Reference number 60 represents the main or gross tuning arm, while reference number 61 depicts the fine tuning arm. Reference numbers 63 and 64 represent conventional serial integrated resistors 20 and 21 may be added to the integrated device which may limit voltage on tunable part of the integrated semiconductor device, the whole in order to obtain high impedance devices, and may make the device exhibit linear current/voltage characteristics.

Figure 11:
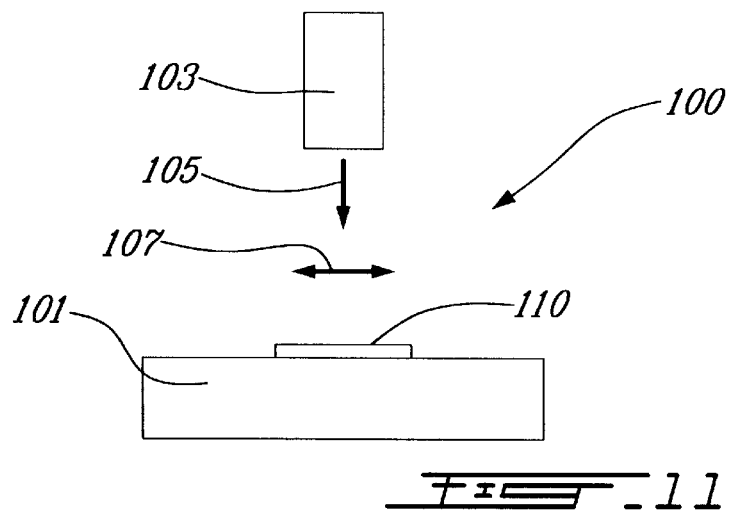
FIG. 11 illustrates a schematic view of the laser system used for the tuning process.
Figure 12:
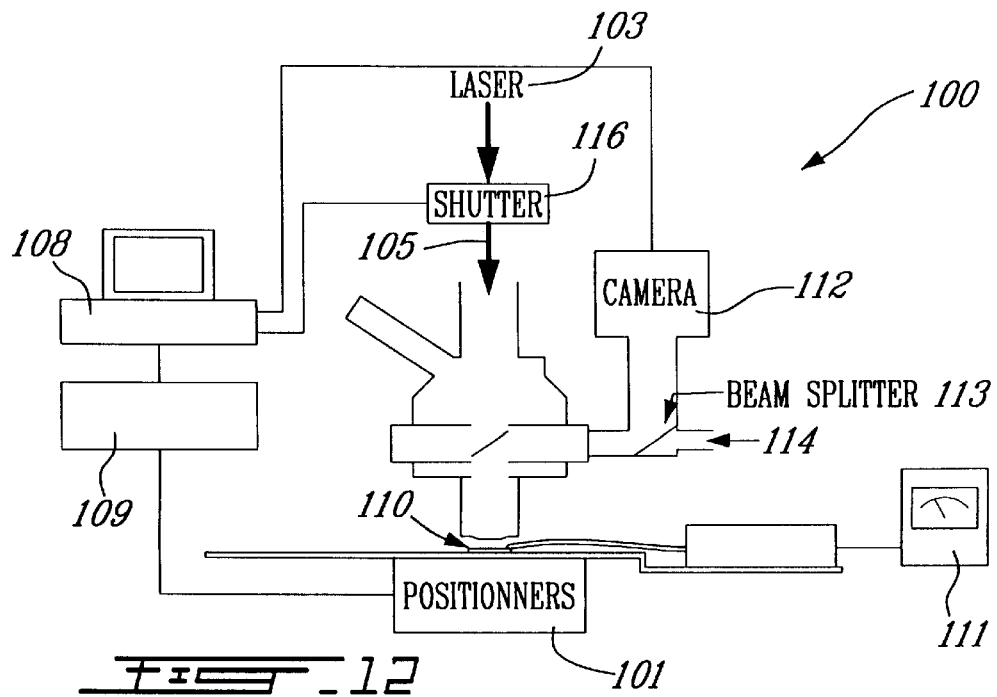
FIG. 12 illustrates a more complete view of the schematic view of the laser system shown in FIG. 11.

Turning to FIGS. 11 and 12 there is illustrated a representation of a general embodiment of an apparatus 100 for modifying the impedance of an integrated semiconductor device using a focussed heating source, such as a laser. An integrated circuit 110 is placed on a positioning table 10, and may be subjected to an application of a heating source 105 which is produced by a focussed heating source 103. Heating source 105 may be focussed on integrated circuit 110 by using optic or magnetic lenses 107, and a system of cameras and mirrors allows for the observation of the integrated circuit 110 in order to ensure accurate alignment of the heating source 105. FIG. 12 shows apparatus 100 in greater detail. Laser 103 is connected to shutter 116, each of which is controlled by the control system shown as a computer 108. Also connected to computer 108 is the control mechanism 109 of the positioners 101. The apparatus 100 further comprises a camera 112, and a light source 114. A further component of the apparatus 100 is a beam splitter 113, and a selective mirror 120.

Figures 13, 14:
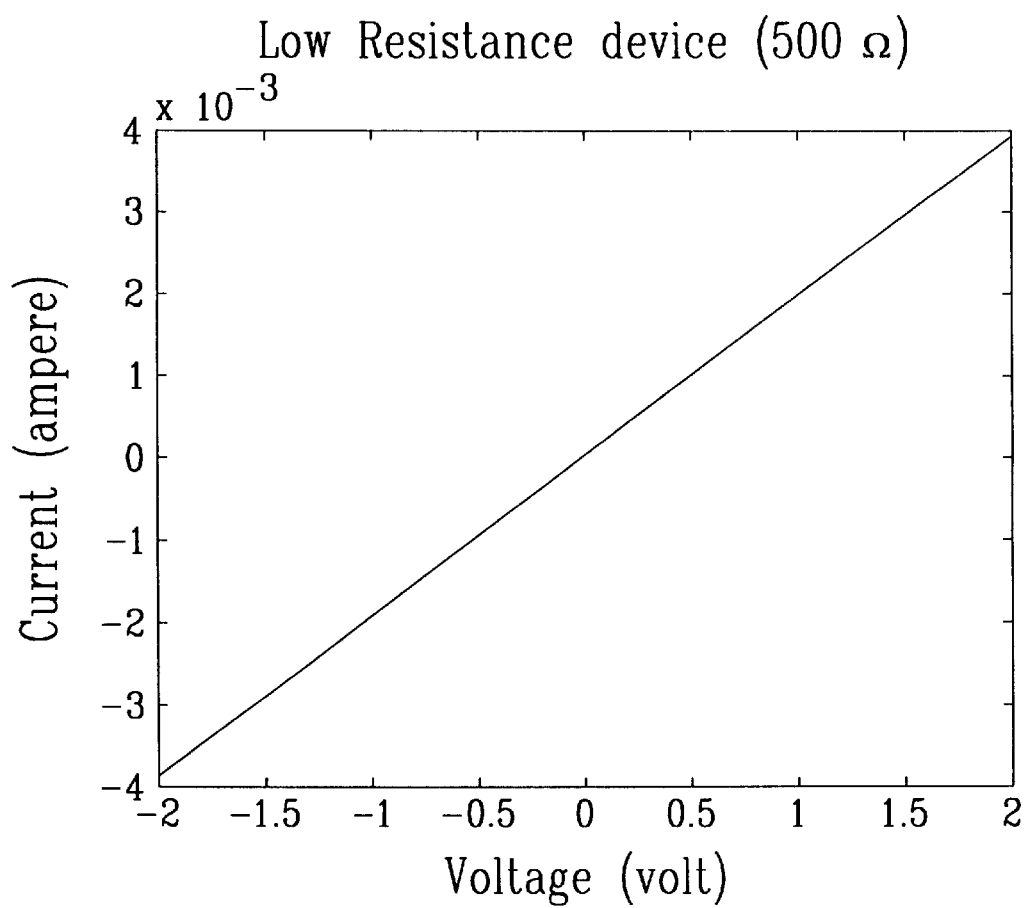
FIG. 13 illustrates table of showing an embodiment of the number of iterations and other data of a given impulsion.
FIG. 14 is a typical current/voltage curve of a tunable integrated semiconductor device having low resistance value.

Turning to FIG. 13, there is shown a chart illustrating an example of the number of applications required to obtain a given resistance across an integrated semiconductor device. The chart illustrates some of the various characteristics of a focussed heating source which may be varied during the iterative steps. Column 1 indicates the number of applications of a focussed heating source, column 2 represents the power in milliwatt of the focussed heating source, column 3 indicates the duration of the application of the focussed heating source (in micro seconds), column 4 shows the diameter of the focussed heating source in micro meters, and the last column is the attained resistance across the example integrated semiconductor device. For example, the first application comprises a focussed heating source of a power of 1400 milliwatt, applied for 1.4 microseconds, and having a focussed beam source diameter of 4 micro meters. The resulting resistance is 188.9 ohms. A second application having identical characteristics was applied wherein the resistance of the integrated semiconductor devices dropped 148.6 ohms. By the third application, the power of the laser application remained unchanged, yet the duration of the application was reduced from 1.4 microseconds to 0.96 microseconds, with a resulting resistance of 142.8 ohms. By the fourth application, the power was unchanged but the duration of the application dropped to 0.48 microseconds and the resulting resistance was down to 141.4 microseconds. For the fifth application, the power was reduced to 200 milliwatt, the duration of the application remained at 0.48 microseconds and the resistance value dropped to 140.1 ohm. Finally, for the 6th and last application, the characteristics of the focussed heating source remained unchanged and the resistance dropped to 140.0 ohm. As may be seen, the last iteration in accordance with the embodiment of the present invention, caused a change of 0.1 ohm in the impedance of the device, which can be considered to be very fine tuning of the device.

As can be seen from the table illustrated at FIG. 13, the iterative process of a particular embodiment of the present invention has progressively dropped the resistance across the integrated semiconductor device, through the application of a number of pulses from a focussed heating source, wherein the characteristics of the heating pulse were modified, as required in order to effect a progressively closer result to the final desired result.

Turning to FIG. 14 there is illustrated a current voltage curve of a tunable integrated semiconductor device having a low resistance value. In order to obtain integrated semiconductor devices with the required precise impedance characteristics, a very precise control of dopant diffusion into lightly doped region 5 (as shown by reference number 5 in FIGS. 1 to 5) may be necessary. For example, if an integrated semiconductor device oflow or very low impedance (i.e. resistance) is required, the controlled diffusion in accordance with an embodiment of the present invention may require a significant amount of dopants to diffuse into lightly doped region 5 from heavily doped region 3 and 4. The end result in accordance with this embodiment may be, for example, to create a quasi-uniform dopants distribution from heavily doped region 3, across (formerly lightly) doped region 5 and through heavily doped region 4 as shown in FIGS. 1–5. In such situation, voltage/current curve of the tuned integrated semiconductor device may show excellent linearity as illustrated in FIG. 14.

Alternatively, applications may call for a high impedance (i.e. resistance) device, which may be obtained by controlled diffusion of a small or minimum amount of dopant into lightly doped region 5 from heavily doped region 3 and 4. As a result, in accordance with this embodiment, there may be a non-uniform distribution of dopant in the lightly doped region 5 between heavily doped regions 3 and 4. It is known that non-uniform doping in semiconductor devices creates non-linear phenomena. In such a situation, voltage/current curve of the tuned integrated semiconductor device may show strong non-linear characteristics as depicted in FIG. 15.

Figure 15:
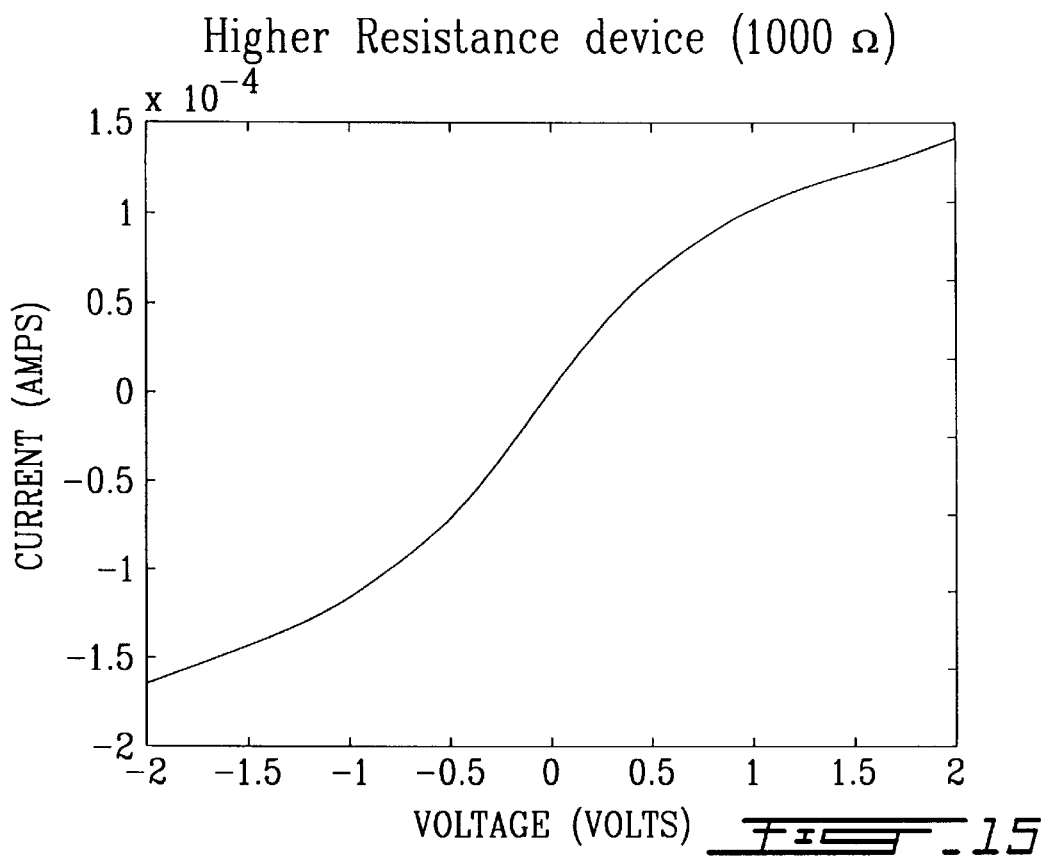
FIG. 15 is a typical current/voltage curve of a tunable integrated semiconductor device having high resistance value.
Figure 16:
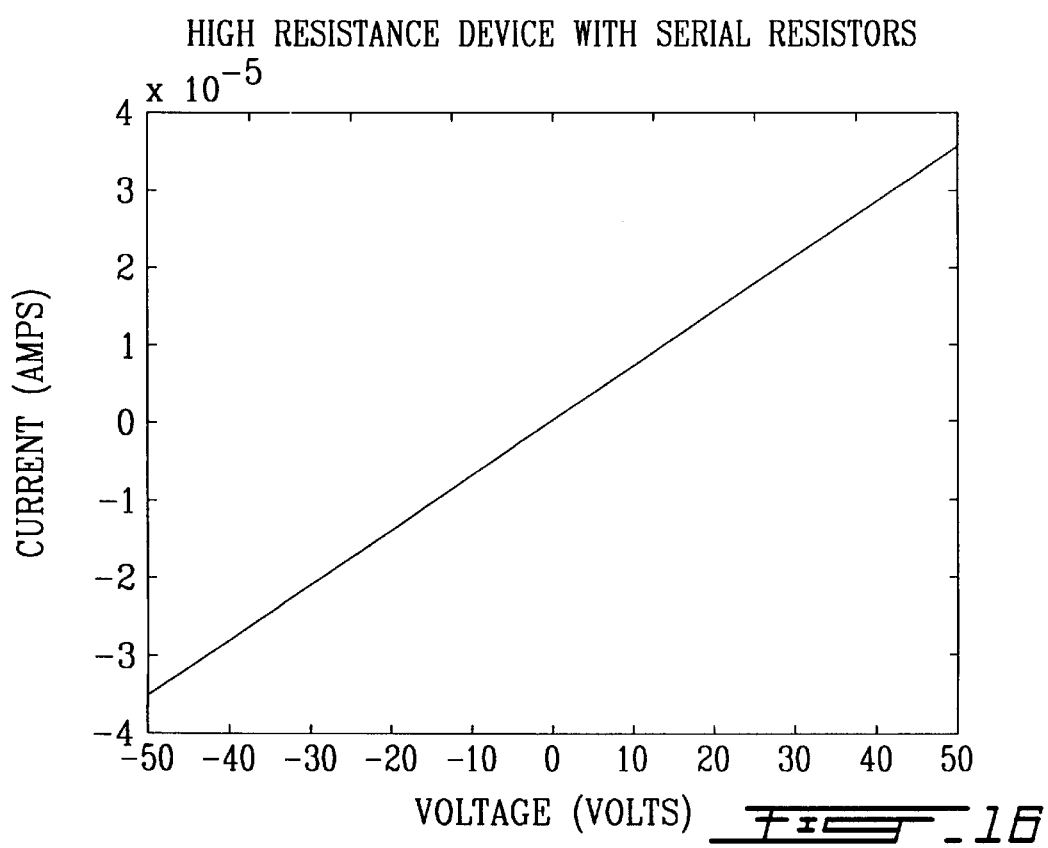
FIG. 16 is a typical current/voltage curve of a tuned integrated semiconductor device using serial resistors.

To solve this problem and to obtain high impedance devices, conventional serial integrated resistors 20 and 21 may be added which may limit voltage on tunable part of the integrated semiconductor device and may make it work in the linear region of the FIG. 15, as illustrated in FIG. 16.

FIG. 16 illustrates a current voltage curve for an integrated semiconductor device similar to that shown in FIG. 15, but wherein the integrated semiconductor device further comprises serial resistors 59a and 59b. This has the effect of creating a linear current voltage curve of the apparatus.

We claim:

1. A method of iteratively, selectively and accurately tuning the impedance of an integrated semiconductor device by controlled diffusion of dopants from a first region having a first dopant concentration to an immediately adjacent second region having a lower dopant concentration than said first region comprising the steps of:

directing a focussed heating source to a selected area which straddles a portion of each of said first region and said second region, and applying a heating pulse from said focussed heating source thereto, wherein said heating pulse melts said selected area thereby allowing the controlled diffusion of dopants from said first region to said second region, allowing said melted selected areas to solidify, said solidified selected area now being a third region having a dopant concentration which is intermediate the dopant concentration of said first region and said second region, measuring the impedance of said semiconductor device to determine if said impedance is either higher than required, or lower than required, and if said impedance is higher than required, then directing said focussed heating source to a portion of said first region adjacent to said third region and applying a heating pulse thereto, wherein said heating pulse melt said portion of said first region and further melts said adjacent third region thereby allowing for the controlled diffusion of additional dopants from said melted portion of said first region to said melted third region, and allowing said melted areas to solidify, or if said impedance is lower than required, then directing said focussed heating source to a portion of said second region adjacent to said third region and applying a heating pulse thereto, wherein said heating pulse melts said portion of said second region and further melts said adjacent third region thereby allowing for the controlled diffusion of dopants from said third region to said melted portion of said second region, and allowing said melted areas to solidify, and repeating the iterative steps until the desired impedance of said integrated semiconductor device is achieved.

2. The method of claim 1 wherein subsequent to the application of each said heating pulse, the impedance of said semiconductor device is determined and if required, the characteristics of the subsequent heating pulse are adjusted prior to the application thereof such that the quantity of dopants which diffuse from any one region into another region can be further accurately controlled.

3. The method of claim 2 wherein each said heating pulse is of a duration of between 1.0 picosecond and 10 microseconds long.

4. The method of claims 2 wherein each said heating pulse is of a duration of between 1.0 femtosecond and 1.0 millisecond long.

5. The method of claim 2 wherein said characteristics of said heating pulse comprise
the duration of said heating pulse,
the power of said heating pulse,
the spot diameter of said heating pulse, and
the positioning and the angle of application of said heating pulse.

6. The method of claim 5 wherein said focussed heating source is selected from a group comprising a laser and an electron beam.

7. The method of claim 1 wherein said integrated semiconductor device comprises a substrate comprising a material selected from the group comprising silicon, gallium arsenide, silicon-germanium, compounds selected from columns III–V and II–VI of the periodic table, and compounds having a IV—IV alloy.

8. The method of claim 1 wherein said dopant is selected from the group comprising boron, phosphorus, aluminium, antimony, arsenic, gallium, indium, lithium, thallium and bismuth.

9. The method of claim 1 wherein the energy of the heating pulses is low enough to avoid damaging any upper layers of the devices.

10. The method of claim 1 wherein the doped regions are configured and disposed to all be on the same plane.

11. A method for the iterative, controlled modification of the relative dopant profile of a pre-selected region of a semiconductor component, said semiconductor component comprising two adjacent doped regions of different dopant concentration, said method comprising
a) applying a tuning cycle to a pre-selected area which encompasses a portion of each of a first doped region and a second doped region having different dopant concentrations, said tuning cycle comprising the following steps
i) a heating/cooling treatment comprising directing a pre-determined heating pulse, from a focussed heating source, for a pre-determined pulse duration sufficient
to melt said preselected area and
to alter the dopant profile of the pre-selected area
and subsequent to said pulse allowing said melted pre-selected area to solidify with an altered dopant profile
ii) determining the relevative dopant profile of said semiconductor component subsequent to said heating/cooling treatment and
iii) comparing the relative dopant profile obtained from step ii) with a predetermined relevative dopant profile.
and
b) if necessary, repeating said tuning cycle one or more additional times until said predetermined relative dopant profile is achieved.

12. The method of claim 11 wherein if required, one or more characteristic of an additional heating pulse is adjusted prior to the application thereof.

13. The method of claim 11 wherein each said heating pulse is of a duration of between 1.0 picosecond and 10 microseconds long.

14. The method of claims 11 wherein each said heating pulse is of a duration of between 1.0 femtosecond and 1.0 millisecond long.

15. The method of claim 12 wherein said characteristics of said heating pulse comprise
the duration of said heating pulse,
the power of said heating pulse,
the spot diameter of said heating pulse, and
the positioning and angle of application of said heating pulse.

16. The method of claim 11 wherein said focussed heating source is selected from a group consisting of a laser and an electron beam.

17. The method of claim 11 wherein said semiconductor component comprises a substrate comprising a material selected from the group comprising silicon, gallium arsenide, silicon-germanium, compounds selected from columns III–V and II–VI of the periodic table, and compounds having a IV—IV alloy.

18. The method of claim 11 wherein a dopant is selected from the group comprising boron, phosphorus, aluminium, antimony, arsenic, gallium, indium, lithium, thallium and bismuth.

19. The method of claim 11 wherein said first doped region and said second doped region are configured and disposed to be on the same horizontal plane.

20. The method of claim 11 wherein subsequent to the manufacture of the integrated semiconductor device, no ion implantation step is required prior to the application of said first heating pulse.

21. A method for the iterative, controlled modification of the impedance of a semiconductor component, said semiconductor component component comprising two adjacent doped regions of different dopant concentration, said method comprising
a) applying a tuning cycle to a pre-selected area which encompasses a portion of each of a first doped region and a second doped region having different dopant concentrations, said tuning cycle comprising the following steps
i) a heating/cooling treatment comprising directing a pre-determined heating pulse, from a focussed heating source, for a pre-determined pulse duration sufficient
to melt said preselected area and
to alter the dopant profile of the pre-selected area
and subsequent to said pulse allowing said melted pre-selected area to solidify with an altered dopant profile
ii) determining, the impedance of said semiconductor component subsequent to said heating/cooling, treatment and
iii) comparing the impedance obtained from step ii) with a predetermined impedance
and
b) if necessary, repeating said tuning cycle one or more additional times until said predetermined impedance is achieved.

22. The method of claim 21 wherein if required, one or more characteristic of an additional heating pulse is adjusted prior to the application thereof.

23. The method of claim 21 wherein each said heating pulse is of a duration of between 1.0 picosecond and 10 microseconds long.

24. The method of claims 21 wherein each said heating pulse is of a duration of between 1.0 femtosecond and 1.0 millisecond long.

25. The method of claim 22 wherein said characteristics of said heating pulse comprise the duration of said heating pulse, the power of said heating pulse, the spot diameter of said heating pulse, and the positioning and angle of application of said heating pulse.

26. The method of claim 21 wherein said focussed heating source is selected from a group consisting of a laser and an electron beam.

27. The method of claim 21 wherein said semiconductor component comprises a substrate comprising a material selected from the group comprising silicon, gallium arsenide, silicon-germanium, compounds selected from columns III–V and II–VI of the periodic table, and compounds having a IV—IV alloy.

28. The method of claim 21 wherein a dopant is selected from the group comprising boron, phosphorus, aluminium, antimony, arsenic, gallium, indium, lithium, thallium and bismuth.

29. The method of claim 21 wherein said first doped region and said second doped region are configured and disposed to be on the same horizontal plane.

30. The method of claim 21 wherein subsequent to the manufacture of the integrated semiconductor device, no ion implantation step is required prior to the application of said first heating pulse.

* * * * *